(12) United States Patent
Xu

(10) Patent No.: US 7,097,707 B2
(45) Date of Patent: Aug. 29, 2006

(54) GAN BOULE GROWN FROM LIQUID MELT USING GAN SEED WAFERS

(75) Inventor: Xueping Xu, Stamford, CT (US)

(73) Assignee: Cree, Inc., Durham, NC (US)

( * ) Notice: Subject to any disclaimer, the term of this patent is extended or adjusted under 35 U.S.C. 154(b) by 577 days.

(21) Appl. No.: 10/328,223

(22) Filed: Dec. 23, 2002

(65) Prior Publication Data
US 2004/0003495 A1   Jan. 8, 2004

Related U.S. Application Data

(60) Provisional application No. 60/345,703, filed on Dec. 31, 2001.

(51) Int. Cl.
*C30B 15/04* (2006.01)

(52) U.S. Cl. .............. 117/13; 117/14; 117/20; 117/81; 117/82; 117/83

(58) Field of Classification Search .......... 117/13, 117/14, 20, 81, 82, 83
See application file for complete search history.

(56) References Cited

U.S. PATENT DOCUMENTS

| | | | |
|---|---|---|---|
| 5,679,152 A | 10/1997 | Tischler et al. | |
| 5,868,837 A | 2/1999 | DiSalvo et al. | |
| 6,156,581 A | 12/2000 | Vaudo et al. | |
| 6,398,867 B1 * | 6/2002 | D'Evelyn et al. | 117/11 |
| 6,413,627 B1 * | 7/2002 | Motoki et al. | 428/332 |
| 6,509,651 B1 * | 1/2003 | Matsubara et al. | 257/461 |
| 2002/0011599 A1 * | 1/2002 | Motoki et al. | 257/76 |
| 2002/0063258 A1 * | 5/2002 | Motoki | 257/95 |
| 2002/0189532 A1 * | 12/2002 | Motoki et al. | 117/99 |
| 2004/0031978 A1 * | 2/2004 | D'Evelyn et al. | 257/233 |

OTHER PUBLICATIONS

U.S. Appl. No. 08/955,168, filed Oct. 21, 1997, Tischler et al.
U.S. Appl. No. 09/179,049, filed Oct. 26, 1998, Vaudo et al.
U.S. Appl. No. 09/524,062, filed Mar. 13, 2000, Vaudo et al.
U.S. Appl. No. 09/605,195, filed Jun. 28, 2000, Flynn et al.
U.S. Appl. No. 09/929,789, filed Aug. 14, 2001, Tischler et al.
U.S. Appl. No. 09/933,943, filed Aug. 21, 2001, Tischler et al.
S. Porowski and I. Grzegory, J. Cryst. Growth, vol. 178, 174 (1997).
Inoue et al, J. Cryst. Growth, vol. 229, 35 (2001).
Phys. Stat. Sol (a) vol. 180, 51 (2000).
Aoki et al, J. Cryst. Growth, vol. 218, 7 (2000).
D.R. Ketchum, J.W. Kolis, J. Cryst. Growth, vol. 222, 431 (2001).

* cited by examiner

*Primary Examiner*—Robert Kunemund
(74) *Attorney, Agent, or Firm*—Vincent K. Gustafson; Intellectual Property/Technology Law; Julio A. Garceran

(57) ABSTRACT

A method of making a single crystal GaN boule, comprising contacting a GaN seed wafer with a GaN source environment under process conditions including a thermal gradient in the GaN source environment producing growth of gallium nitride on the GaN seed wafer, thereby forming the GaN boule. The GaN source environment in various implementations includes gallium melt in an ambient atmosphere of nitrogen or ammonia, or alternatively, supercritical ammonia containing solubilized GaN. The method produces single crystal GaN boules >10 millimeters in diameter, of device quality suitable for production of GaN wafers useful in the fabrication of microelectronic, optoelectronic and microelectromechanical devices and device precursor structures therefor.

47 Claims, 4 Drawing Sheets

GAN BOULE GROWN FROM LIQUID MELT USING GAN SEED WAFERS

CROSS-REFERENCE TO RELATED APPLICATIONS

This application claims priority to U.S. Provisional Patent Application No. 60/345,703, filed on Dec. 31, 2001 and entitled "GaN BOULE GROWN FROM LIQUID MELT USING GaN SEED WAFERS."

GOVERNMENT RIGHTS IN INVENTION

Work related to the invention was done in the performance of U.S. Government Contract DASG60-00-C-0036 and N00014-00-3-0013. The government has certain rights in the invention.

BACKGROUND OF THE INVENTION

1. Field of the Invention

The invention generally relates to GaN boule growth from a liquid melt using a GaN seed wafer, to produce a GaN boule yielding wafers suitable for fabrication of microelectronic and optoelectronic devices.

2. Description of the Related Art

GaN is a promising wide bandgap semiconductor material for optoelectronics and power electronics. Realization of its full potential is however limited by a lack of suitable bulk GaN substrates. Because GaN has a high melting temperature and a very high decomposition pressure at the melting point, bulk crystals of nitrides cannot be grown with conventional methods such as Czochralski or Bridgmen growth from stoichiometric melts.

Porowski et al disclosed a method of growing bulk GaN at high nitrogen pressure (S. Porowski and I. Grzegory, J. Cryst. Growth, Vol 178, 174 (1997)). Metallic gallium reacted with gaseous nitrogen to form gallium nitride crystals at the surface of the gallium melt. A temperature gradient was provided in the reactor vessel, resulting in supersaturation of nitrogen atoms in the cooler region of the reactor and growth of gallium nitride crystals. Small crystals of GaN were grown at a nitrogen pressure as high as 20000 atmospheric pressure and a temperature as high as 2000 K. However, the growth rate was small and long growth time of 60–150 hours was needed in order to grow crystal platelets of 6–10 mm in length and ~0.1 mm in thickness. The small size of the crystal grown by this technique is not suitable as substrates for electronic and optoelectronic applications.

Inoue et al disclosed another method of growing bulk GaN at high nitrogen pressure and at high temperatures (Inoue et al, J. Cryst. Growth, Vol. 229, 35 (2001), and Phys. Stat. Sol. (a) Vol. 180, 51 (2000)). The difference between Inoue's technique and Porowski's technique is that Inoue uses nitrogen over-pressure to produce supersaturation of nitrogen in the gallium melt and formation of gallium nitride crystals in the gallium melt. Similar to Porowski's technique, Inoue's technique produces small GaN crystal platelets (<10 mm in length), and not suitable as substrate for commercial device applications. Furthermore, the high temperature and high pressure needed for the crystal growth provide additional challenges to scale up the size of the crystal with these techniques.

Single crystal GaN can also be grown with a so-called sodium flux method (see, for example, Aoki et al, J. Cryst. Growth, Vol. 218, 7 (2000) and DiSalvo et al, U.S. Pat. No. 5,868,837). DiSalvo et al disclosed a method of synthesis GaN by thermally decomposing sodium azide in a closed reactor zone (autoclave) containing metallic gallium. The autoclave was heated to 600–800C., where sodium azide decomposed to gaseous nitrogen that pressurized the system. However, the crystal size was small, in the millimeter range, even for growth of several days. Aoki et al disclosed a similar method of synthesizing GaN by reacting gaseous nitrogen with a metallic mixture of gallium and sodium at moderate temperature and pressure. At a growth temperature of 750C., a growth pressure of about 50 atmospheric pressure, and sodium molar ratio of 0.6, GaN crystal platelets of size in millimeter ranges were produced after 200 hours of growth. The small crystal size and slow grow rate limit the application of this growth technique.

Ketchum et al disclosed a method of growing gallium nitride crystals in supercritical ammonia using GaN powder as feedstock (D. R. Ketchum, J. W. Kolis, J. Crsyt. Growth, Vol 222, 431 (2001)). The feedstock was transported to form single crystals through the use of mineralizer. However, largest crystal obtained was only about 0.5 mm, which is not suitable as substrates for electronic and optoelectronic devices.

GaN substrates based on hydride vapor phase epitaxy (HVPE) are currently being developed, but such substrates suffer from various process-related deficiencies that have hindered their development and commercial availability. HVPE is a vapor phase growth process. Vapor phase growth is not an equilibrium growth technique and typically generates a significant level of defects, but has the advantage that the process is able to be carried out at relatively low temperature levels (e.g., ~1000° C.).

The art is in need of improved low-cost processing techniques capable of forming large size wafers of GaN suitable for fabrication of optoelectronic and microelectronic devices.

Such large size wafers in turn require correspondingly sized boules, i.e., bulk masses of GaN from which multiple wafers can be derived, as for example by cutting with wire saws, blade saws, laser cutters, cleaving, etc.

Unfortunately, GaN boules cannot be grown with conventional boule growth methods utilized for forming single crystal wafer source bodies of materials such as silicon, because GaN decomposes before melting and a very high equilibrium pressure is necessary for GaN formation from Ga melt at the growth temperature. At the moderate pressures desired for commercial boule growth, the prior art has failed to provide a commercially viable method for forming large diameter (>10 mm diameter) single crystal boules of GaN.

SUMMARY OF THE INVENTION

The present invention relates to bulk growth of GaN using seed wafers to produce large diameter GaN materials.

The bulk growth may be effected in any of various processes more fully described hereinafter. In one type of approach, bulk growth is carried out by pulling a seed from a melt. In another type of approach, large crystals are grown at steady conditions in liquid melts.

In one broad aspect, the invention relates to a method of making a single crystal GaN boule, comprising contacting a GaN seed wafer with a GaN source environment under process conditions including a thermal gradient in the GaN source environment producing growth of gallium nitride on the GaN seed wafer, thereby forming the GaN boule, wherein the source environment is selected from the group consisting of:
    a source environment comprising gallium melt and a nitrogen source; and
    a source environment comprising supercritical ammonia containing solubilized GaN.

In another aspect, the invention relates to a method of making a GaN boule, comprising:
    providing a gallium melt; and
    contacting a GaN seed wafer with the gallium melt in the presence of a nitrogen source and under a thermal gradient producing growth of gallium nitride on the GaN seed wafer, thereby forming the GaN boule.

A further aspect of the invention relates to a method of making a single crystal GaN boule, comprising:
    providing a gallium melt; and
    contacting a GaN seed wafer with the gallium melt in the presence of a nitrogen source and under a thermal gradient producing growth of gallium nitride on the GaN seed wafer, thereby forming the GaN boule,
    wherein:
    the GaN seed wafer is attached to a rotatable rod;
    said contacting involves rotating said rotatable rod to rotate the attached GaN seed wafer while pulling the rod and attached GaN seed wafer from the gallium melt during the growth of the GaN boule on the GaN seed wafer;
    said nitrogen source comprises an ammonia atmosphere forming an ambient environment of the gallium melt and GaN seed wafer;
    a GaN crust is formed on a surface of the gallium melt, from reaction between the nitrogen source and the gallium melt;
    said thermal gradient comprises a temperature higher at said GaN crust than at the GaN seed layer, whereby gallium nitride is transported from the crust to the growth of gallium nitride on the GaN seed wafer via dissolved atomic nitrogen in the gallium melt, with GaN in the crust being decomposed into atomic nitrogen with an equilibrium concentration at temperature at the crust, and said atomic nitrogen equilibrium concentration being at supersaturation relative to temperature at the GaN seed wafer, thereby producing homoepitaxial growth of GaN at the seed wafer.

A still further aspect of the invention relates to a method of making a single crystal GaN boule, comprising:
    providing a gallium melt; and
    contacting a GaN seed wafer with the gallium melt in the presence of a nitrogen source and under a thermal gradient producing growth of gallium nitride on the GaN seed wafer, thereby forming the GaN boule,
    wherein:
    the GaN seed wafer is attached to a rotatable rod;
    said contacting involves rotating said rotatable rod to rotate the attached GaN seed wafer while pulling the rod and attached GaN seed wafer from the gallium melt during the growth of the GaN boule on the GaN seed wafer;
    said nitrogen source comprises a nitrogen plasma including atomic nitrogen, nitrogen ion and dinitrogen ion, and forming an ambient environment of the gallium melt and GaN seed wafer;
    the nitrogen plasma is generated by a discharge technique selected from the group consisting of direct current discharge, radio frequency discharge, and microwave discharge;
    the gallium melt temperature is from about 900° C. to about 1500° C.;
    a GaN crust is formed on a surface of the gallium melt, from reaction between the nitrogen source and the gallium melt;
    said thermal gradient comprises a temperature higher at said GaN crust than at the GaN seed layer, whereby gallium nitride is transported from the crust to the growth of gallium nitride on the GaN seed wafer via dissolved atomic nitrogen in the gallium melt, with GaN in the crust being decomposed into atomic nitrogen with an equilibrium concentration at temperature at the crust, and said atomic nitrogen equilibrium concentration being at supersaturation relative to temperature at the GaN seed wafer, thereby producing homoepitaxial growth of GaN at the seed wafer.

Yet another aspect of the invention relates to a method of making a single crystal GaN boule, comprising:
    providing a gallium melt; and
    contacting a GaN seed wafer with the gallium melt in the presence of a nitrogen source and under a thermal gradient producing growth of gallium nitride on the GaN seed wafer, thereby forming the GaN boule,
    wherein:
    the GaN seed wafer is attached to a rotatable rod;
    said contacting involves rotating said rotatable rod to rotate the attached GaN seed wafer while pulling the rod and attached GaN seed wafer from the gallium melt during the growth of the GaN boule on the GaN seed wafer;
    said nitrogen source comprises an ammonia or nitrogen atmosphere forming an ambient environment of the gallium melt and GaN seed wafer;
    the gallium melt is in combination with a flux material forming a molten gallium/flux composition, wherein the flux material increases nitrogen solubility in gallium in said composition;
    the flux material comprises sodium;
    the flux material has a concentration in the molten gallium/flux composition of from about 5% to about 50% by weight, based on the weight of the gallium therein; and
    the gallium/flux composition is at temperature below boiling temperature of the flux material in said composition.

In another aspect, the invention relates to a method of making a single crystal GaN boule, comprising:
    providing a gallium melt; and
    contacting a GaN seed wafer with the gallium melt in the presence of a nitrogen source and under a thermal gradient producing growth of gallium nitride on the GaN seed wafer, thereby forming the GaN boule,
    wherein:
    the nitrogen source comprises a nitrogen pressurized atmosphere;
    the GaN seed wafer is disposed in the gallium melt under the nitrogen pressurized atmosphere,
    the gallium melt may contain a surfactant,
    the gallium melt is heated to provide said thermal gradient in the gallium melt, and
    the GaN seed wafer is in a region of the gallium melt at a lower temperature of said thermal gradient, to promote growth of gallium nitride on the GaN seed wafer.

A further aspect of the invention relates to a method of making a single crystal GaN boule, comprising growing GaN on a GaN seed wafer in a source medium comprising supercritical ammonia containing solubilized GaN, thereby forming the GaN boule comprising GaN grown on said GaN seed wafer.

A still further aspect of the invention relates to a method of making a single crystal GaN boule, comprising growing GaN on a GaN seed wafer in a source medium comprising supercritical ammonia containing solubilized GaN, thereby forming the GaN boule comprising GaN grown on said GaN seed wafer, wherein:
a thermal gradient is established in the source medium, and the GaN seed wafer is in a region of the source medium at a lower temperature of said thermal gradient, to promote growth of gallium nitride on the GaN seed wafer;
the solubilized GaN derives from addition of powdered GaN to ammonia and heating of the ammonia to form supercritical ammonia in which said powdered GaN is dissolved to form said solubilized GaN; and
said source medium comprises a solubilizing component enhancing the solubility of GaN in ammonia, said solubilizing component comprising $KNH_2$ or KI.

Various other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
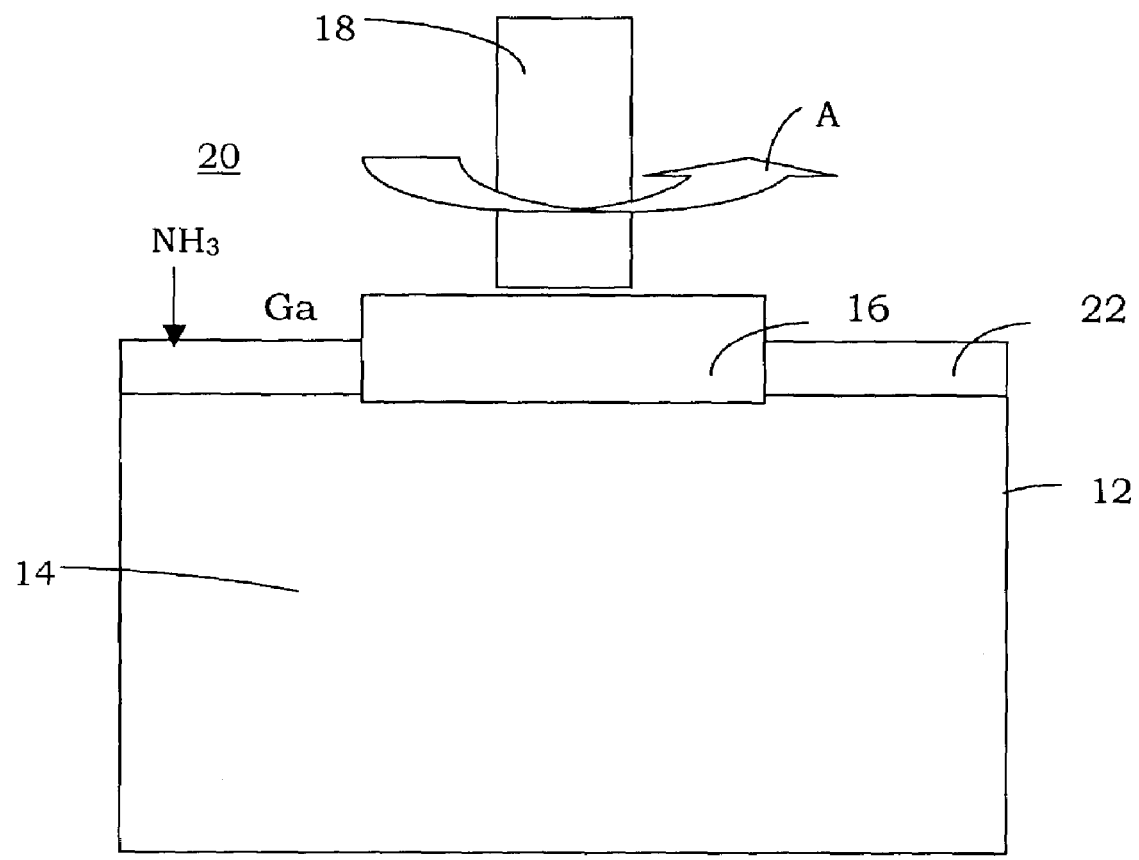
FIG. 1 is a schematic depiction of pulling a gallium nitride boule from gallium melt in an ammonia ambient atmosphere.

The disclosures of the following United States Patents and United States Patent Applications, collectively referred to hereinafter as "Bulk GaN Technology References," are hereby incorporated herein by reference in their respective entireties:

U.S. patent application Ser. No. 08/188,469 filed Jan. 27, 1994 in the names of Michael A. Tischler, et al., now issued as U.S. Pat. No. 5,679,152;

U.S. patent application Ser. No. 08/955,168 filed Oct. 21, 1997 in the names of Michael A. Tischler, et al.;

U.S. patent application Ser. No. 08/984,473 filed Dec. 3, 1997 in the names of Robert P. Vaudo, et al., now issued as U.S. Pat. No. 6,156,581;

U.S. patent application Ser. No. 09/179,049 filed Oct. 26, 1998 in the names of Robert P. Vaudo, et al.;

U.S. patent application Ser. No. 09/524,062 filed Mar. 13, 2000 in the names of Robert P. Vaudo, et al.;

U.S. patent application Ser. No. 09/605,195 filed Jun. 28, 2000 in the names of Jeffrey S. Flynn, et al.;

U.S. patent application Ser. No. 09/929,789 filed Aug. 14, 2001 in the names of Michael A. Tischler, et al.; and U.S. patent application Ser. No. 09/933,943 filed Aug. 21, 2001 in the names of Michael A. Tischler, et al.

The present invention relates to GaN boule growth from liquid melt using GaN seed wafers, and is described hereafter with respect to various embodiments of the invention. In one aspect of the invention, boule growth is effected by techniques involving pulling a seed from a melt. Another aspect of the invention involves growing large crystals at steady conditions in liquid melts. Three respective embodiments of the GaN seed pulling approach (Processes A, B and C) are set out hereinafter, followed by two respective embodiments of the crystal growth approach involving steady conditions in liquid melts (Processes D and E).

It will be appreciated that GaN boule growth in accordance with the invention may be carried out in a widely varied manner as regards the ensuing description, and specific features and process conditions in the respective embodiments of Processes A-E are therefore not intended to be limitingly construed, as regards their more general applicability within the scope of the invention.

The invention enables formation of large diameter single crystal boules of GaN, having a diameter of at least about 10 millimeters, e.g., in various ranges of from about 15 millimeters, 20 millimeters, 25 millimeters, or 30 millimeters, at a lower end of the ranges, up to 50 millimeters, 100 millimeters, 150 millimeters, 200 millimeters, 250 millimeters, 300 millimeters or even larger diameter at an upper end of such ranges, with all permutations of such range values being contemplated in various embodiments of the invention for the single crystal GaN boules hereof.

More generally, the dimensions of the product GaN articles achievable in the practice of the present invention include varied dimensions as described for bulk GaN by the aforementioned Bulk GaN Technology References.

The invention is now described with reference to various specific embodiments of Processes A–E.

Process A:

GaN Boule Growth by Pulling a Seed from Melt Over Moderate Ammonia Pressures

In this process, a GaN boule is pulled from gallium melt using a GaN seed wafer. The process is illustrated with reference to FIG. 1, which depicts the process system 10 as including a gallium reservoir 12, e.g., a crucible, filled with molten gallium 14.

At the surface of the molten gallium, gallium nitride seed 16 mounted on a rotatable shaft 18 motively engaged with power drive means (not shown), e.g., an electric motor or other motor, power train, or the like, arranged to rotate the rotatable shaft 18.

The seed crystal can be any suitable single crystal gallium nitride. For example, large area GaN single crystal wafers can be produced by hydride vapor phase epitaxy, and can be used as a seed for boule growth from liquid melt. After formation of the boules from the liquid melt, the boules can be sliced and polished to form new seeds. The seed crystals can be chemical-mechanical polished or etched to remove surface and subsurface damage.

The seed crystal can be attached to the supporting rod by several methods. For example, high temperature cement such as carbon or ceramic cement can be used. Mechanical means can also be used to secure the seed crystal on the supporting rod. If cement is used, it should be completely outgassed before loading into reactor vessel. Inert supporting rod should be used. The choice of crystal attachment on the supporting rod depends on the size and thermal expansion coefficient of the materials used. It should enable secure attachment of seed crystal, providing seed rotation, and controllable temperature gradient between the growing surface and gallium melt.

The reactor vessels required to implement the invention should be compatible with the temperature and pressure needed for the growth, and provide required temperature and temperature gradient control, pressure control, and impurity control. After loading the seed crystal in the reactor vessel and gallium in the crucible, the reactor is thoroughly purged with the desired gaseous nitrogen source to remove any gaseous impurities.

Above the molten gallium 14 in gallium reservoir 12 is an atmosphere, or ambient, 20. The atmosphere 20 is constituted by ammonia or an ammonia-containing gas mixture containing other components that are compatible with reaction of gallium with ammonia to form GaN. On the surface of the gallium in the gallium reservoir 12 is a GaN crust 22 extending radially outwardly from the GaN seed 16.

In operation of the FIG. 1 process system, a GaN boule is pulled from the gallium melt 14 using the gallium nitride seed wafer 16. The GaN seed wafer 16 is in contact with the gallium melt and the rotating supporting rod 18 is pulled up at a predetermined rate. The reservoir 12 is disposed in a furnace or reactor vessel (not shown) to which ammonia is flowed at a moderate pressure (e.g., on the order of a few atmospheres) to constitute the ambient gas environment above the gallium melt.

After heating in the reactor vessel, the ammonia will react with the gallium at the surface of the gallium melt in reservoir 12, forming a GaN crust 22 above the gallium reservoir. The presence of ammonia in the ambient atmosphere prevents the decomposition of the GaN seed wafer where it is exposed to the ammonia. There is a finite solubility of nitrogen in the metallic gallium, and the source of the nitrogen is the decomposition of GaN in the crust and in the seed wafer according to the following equilibrium reaction equation:

$$GaN\ (solid) \leftrightarrows Ga\ (liquid) + N\ (solute)$$

By the provision of a proper temperature gradient, the temperature at the crust is higher than the temperature at the seed wafer 16, so that gallium nitride is transported from the crust to the growing boule via dissolved atomic nitrogen in the gallium. GaN in the crust is decomposed into atomic nitrogen with an equilibrium concentration for the temperature at the crust. However, this nitrogen concentration is at supersaturation relative to the lower temperature at the seed wafer, producing homoepitaxial growth of GaN at the seed wafer. By rotating the seed wafer, and gradually pulling up the seed, a GaN boule is formed.

The upward pull rate of the GaN seed is determined by various factors, including gallium reservoir temperature, temperature gradient, and ammonia pressure. The pressure of the reactor can be suitably selected appropriate to the reactor design, and pressures of several atmospheres may be advantageously used in the practice of this embodiment of the invention, although higher or lower pressures may be employed.

The growth temperature in this embodiment should be selected to be sufficiently high for formation of the GaN crust 22. Relatively higher temperatures are preferred, since higher temperatures lead to higher nitrogen solubility and higher growth rate, but the temperature should not exceed the temperature at which ammonia undergoes substantial decomposition, since ammonia is susceptible to decomposition at high temperatures. Since the equilibrium constant for ammonia decomposition depends on both temperature and pressure, it is preferable to have higher growth temperature and pressure. It is also preferable to have high ammonia flow rate to increase the non-equilibrium ammonia partial pressure in the reactor vessel. The growth temperature is preferably above 900° C., and more preferably above 1000° C.

The gallium melt may contain a surfactant to improve the crystal growth on the growing boule surface. One example of such surfactant is bismuth.

[Note: combine this paragraph with paragraph 36] The initial seed wafer 16 can be obtained from an HVPE process, as described more fully in the Bulk GaN Technology References. Subsequent to the formation of the initial seed wafer, further seed wafers can be obtained from similar HVPE processes, or from the previously grown boule itself (with the boule grown in the process of this embodiment constituting a source body for seed wafers for subsequent runs or later processing according to this embodiment of the invention.

Process B

GaN Boule Growth by Pulling a Seed from Melt Over Nitrogen Plasma

As discussed in the preceding section describing Process A, ammonia is susceptible to decomposition at high temperatures, and therefore the Process A embodiment must be conducted at temperatures below those at which substantial decomposition takes place. Solubility of nitrogen in gallium increases with gallium temperature and the ammonia decomposition temperature limitation correspondingly limits the solubility of atomic nitrogen in the gallium melt during the boule formation process, and the boule growth rate.

In Process B, a reactive nitrogen plasma is used as the ambient environment in the boule growth reactor, with the plasma serving as a nitrogen source for GaN crust formation. The use of the nitrogen plasma effectively shifts the equilibrium of GaN formation and decomposition toward GaN formation at low pressure.

In equilibrium growth of gallium nitride, a high temperature is required to grow GaN from $N_2$ because of high activation energy of breaking nitrogen triple bonds. High temperature also increases the solubility of nitrogen in gallium liquid. However, at high temperatures, gallium nitride tends to dissociate. The equilibrium nitrogen pressure increases dramatically with the increase of temperature. GaN is stable up to ~900° C. at ambient pressure (~1 bar); but at a growth temperature of 1500° C., a nitrogen pressure of 20,000 bar is required. This extreme high pressure and high temperature condition limit commercial production of large size gallium nitride wafers. A major limitation of high-temperature, high-pressure GaN growth process is the use of very high pressures (>15,000 bar).

In this embodiment, we disclose a non-equilibrium GaN growth technique in which active nitrogen species, such as atomic nitrogen, is used as the nitrogen source. The active nitrogen species are generated by a plasma. In a nitrogen plasma, many charged and neutral species, such as $N_2^+$, N, $N^+$, are present. The reaction of these active species with gallium are much faster than $N_2$ with gallium.

Furthermore, in the presence of active nitrogen species, the stability of GaN is dramatically increased. For simplistic sake, assuming atomic nitrogen is an active species in the nitrogen plasma, the equilibrium atomic nitrogen pressure for gallium nitride decomposition is $$P_N = P_{N_2}^{1/2} \exp(-\Delta G°/RT)$$

where $\Delta G°$ is the standard Gibbs free energy for nitrogen dissociation reaction, R is the gas constant, T is the temperature, $P_N$ is the equilibrium atomic nitrogen pressure for a hypothetical GaN growth using gaseous atomic nitrogen and gallium, and $P_{N_2}$ is the equilibrium $N_2$ pressure for GaN growth and decomposition. Clearly, the atomic nitrogen pressure required for GaN growth is much lower than the $N_2$ pressure required for the high-temperature high-pressure GaN growth. The equilibrium atomic nitrogen pressure is below 1 μTorr at temperatures below 1800 K. This amount of atomic nitrogen can be easily generated in a plasma source. Other energetic nitrogen species in the nitrogen plasma will further increase the stability of gallium nitrogen in the plasma environment. The growth of large high-quality GaN crystals also depends on other factors such as temperature gradient of the reactor, solubility of nitrogen in the gallium, supersaturation of nitrogen in the solution, plasma chemistry, and growth time. A higher temperature would favor better quality crystal.

To demonstrate the feasibility of GaN bulk growth using nitrogen plasma at relatively low temperature and pressure, we performed the following experiments. Gallium metal was placed in a graphite crucible, and heated to 700–800° C. in vacuum to remove any dissolved gas and gas impurity from the crucible. Subsequently, nitrogen was flowed with a rate of 50 sccm.

Figure 2:
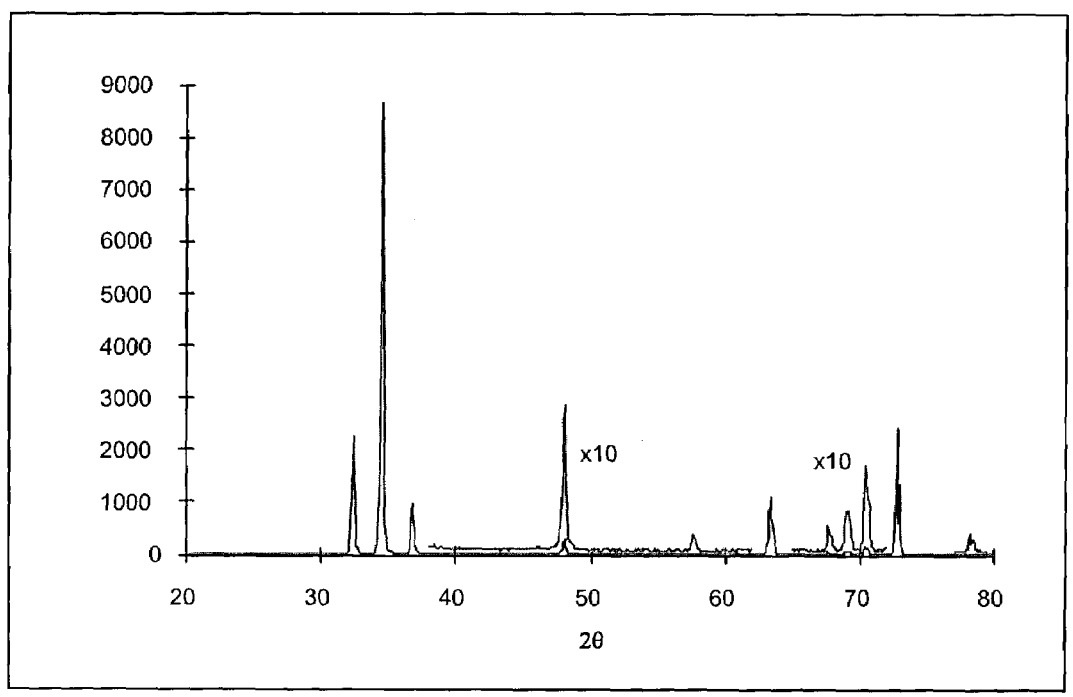
FIG. 2 is x-ray diffraction θ–2θ scan for the gallium nitride crystallites formed by heating gallium melt in nitrogen plasma at 700–800° C.

The pressure of the reactor was ~0.4 Torr. A plasma was ignited. After 64 hours, all gallium melt in the crucible was converted into solid. The solid was etched in aqueous hydrochloric acid to remove any residual gallium metal. Transparent crystallites, ranging from 50–1000 μm, were obtained. X-ray diffraction (FIG. 2) shows that the crystallites are gallium nitride. Small crystallites were produced because seed was not used in this experiment.

Figure 3:
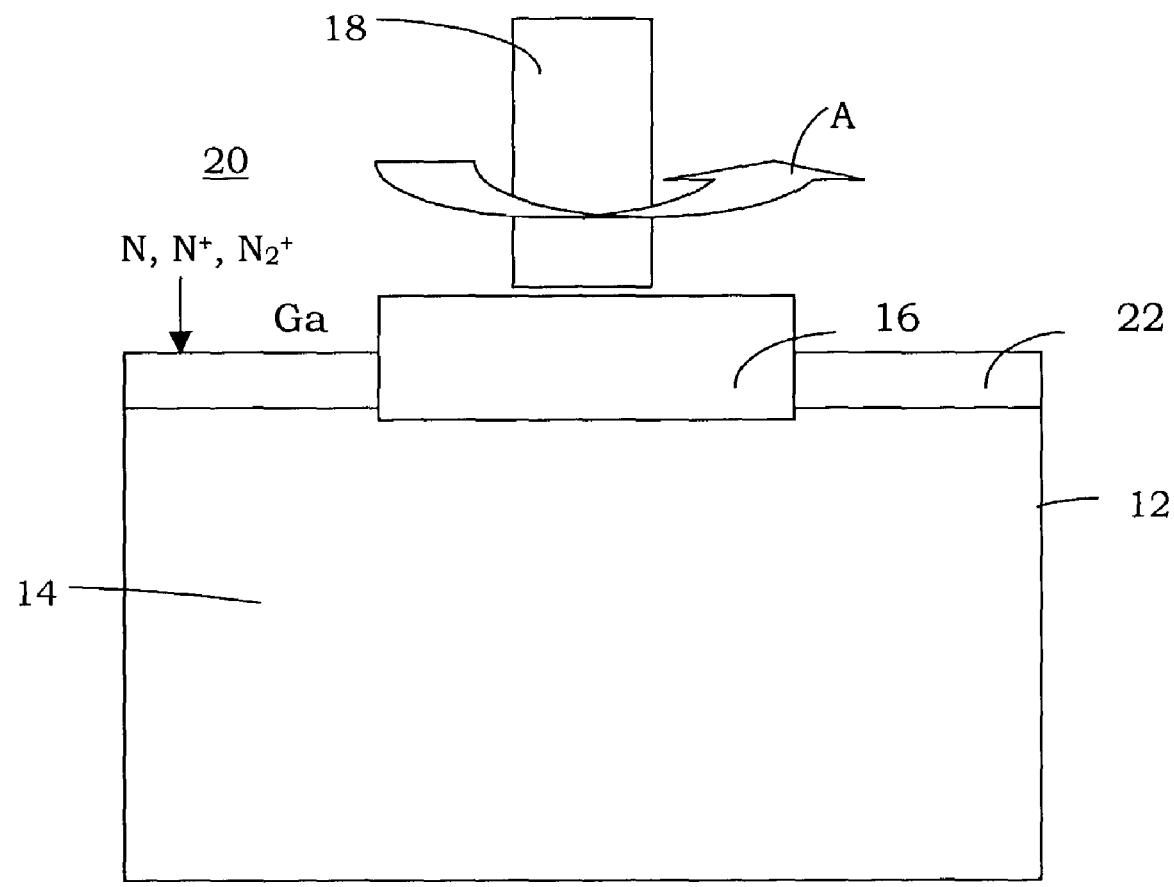
FIG. 3 is a schematic depiction of pulling a gallium nitride boule from gallium melt in a nitrogen plasma ambient.

FIG. 3 is a schematic depiction of a process system 10 wherein all parts are numbered correspondingly to those of FIG. 1, the only difference being that the atmosphere 20 in the FIG. 3 system is constituted by a nitrogen plasma rather than by an ammonia atmosphere as in the FIG. 1 system.

In the operation of the FIG. 3 system, nitrogen is flowed into the reactor (not shown) containing the gallium reservoir 12, and a plasma is formed above the reservoir. After heating up to appropriate temperature, the reactive species in the nitrogen plasma (e.g., atomic nitrogen, nitrogen ion, and dinitrogen ion) react with the gallium to form a GaN crust 22 over the gallium melt 14. The presence of the nitrogen plasma prevents the decomposition of the GaN wafer exposed to the plasma.

The rotating supporting rod 18 is rotated concurrently with upward translation of the rod and the GaN seed-based boule thereon, so that the boule is grown as the rotating rod is upwardly pulled, in the same general manner carried out in Process A. As in such previously described embodiment of Process A, there is a finite solubility of nitrogen in the metallic gallium and the source of nitrogen in the Process B embodiment is likewise the decomposition of GaN in the crust 22 and in the seed wafer according to the equilibrium equation set out hereinabove in the description of Process A.

In the Process B embodiment, a proper temperature gradient is provided, in which the temperature is higher at the crust than at the seed wafer, so that gallium nitride is transported from the crust to the growing boule via atomic nitrogen in the gallium melt.

The Process B pull rate of the boule (upward translation rate of the rotating supporting rod 18) is determined by factors, including gallium reservoir temperature, temperature gradient, plasma source, and reactor pressure, whose optimal values may be readily determined within the skill of the art without undue experimentation. The GaN boule growth rate is determined primarily by the degree of nitrogen supersaturation and the concentration of nitrogen in the melt.

Since the solubility of atomic nitrogen in the gallium melt is increased with temperature, the boule growth rate can be substantially increased by increasing the reservoir temperature. Accordingly, the Process B embodiment can be operated at a substantially higher temperature than the Process A embodiment, providing correspondingly faster boule growth. In Process B, for example, the gallium melt temperature is preferably above 900° C., more preferably above 1000° C. and most preferably above 1100° C., up to maximum temperatures that can for example be 1300° C., 1400° C., 1500° C. or higher. Such embodiment therefore contemplates temperature operation conditions in various suitable ranges, e.g., a range of from about 900° C. to about 1500° C., more preferably from about 1000° C. to about 1400° C., and most preferably from about 1100° C. to about 1300° C.

The nitrogen plasma above the gallium melt in this embodiment of the invention may be formed in any suitable manner in the reactor, as for example by dc discharge, rf discharge, microwave discharge, or other suitable technique for plasma generation. The pressure of the reactor can be conveniently chosen, for example, between a few millitorrs and a few atmospheres, depending on the reactor design and plasma excitation source. Higher or lower pressure can be used, but should be able to sustain the plasma generation.

The gallium melt may contain a surfactant to improve the crystal growth on the growing boule surface. One example of such surfactant is bismuth.

As in Process A, the seed wafer in the Process B embodiment can be initially formed by HVPE or other suitable techniques, and thereafter a similar source of the seed wafer may be employed, or alternatively, wafers cut from the formed boule product may be used for subsequent boule manufacture.

Process C

GaN Boule Growth by Pulling a Seed from Gallium Melt with Metal Flux

In Process B, a GaN boule growth relies on the presence of chemically active gas phase species in the nitrogen plasma to shift chemical equilibria to the formation of GaN at moderate temperature and pressure. In such process, the solubility of nitrogen in the gallium melt is not affected by the presence of active nitrogen species in the gas phase.

In Process C, a metal flux, e.g., sodium or lithium, is added to the gallium melt. The presence of such metal flux increases the solubility of nitrogen in the molten gallium, to facilitate the fast growth of GaN at relatively lower temperature than is achievable in Process B.

Figure 4:
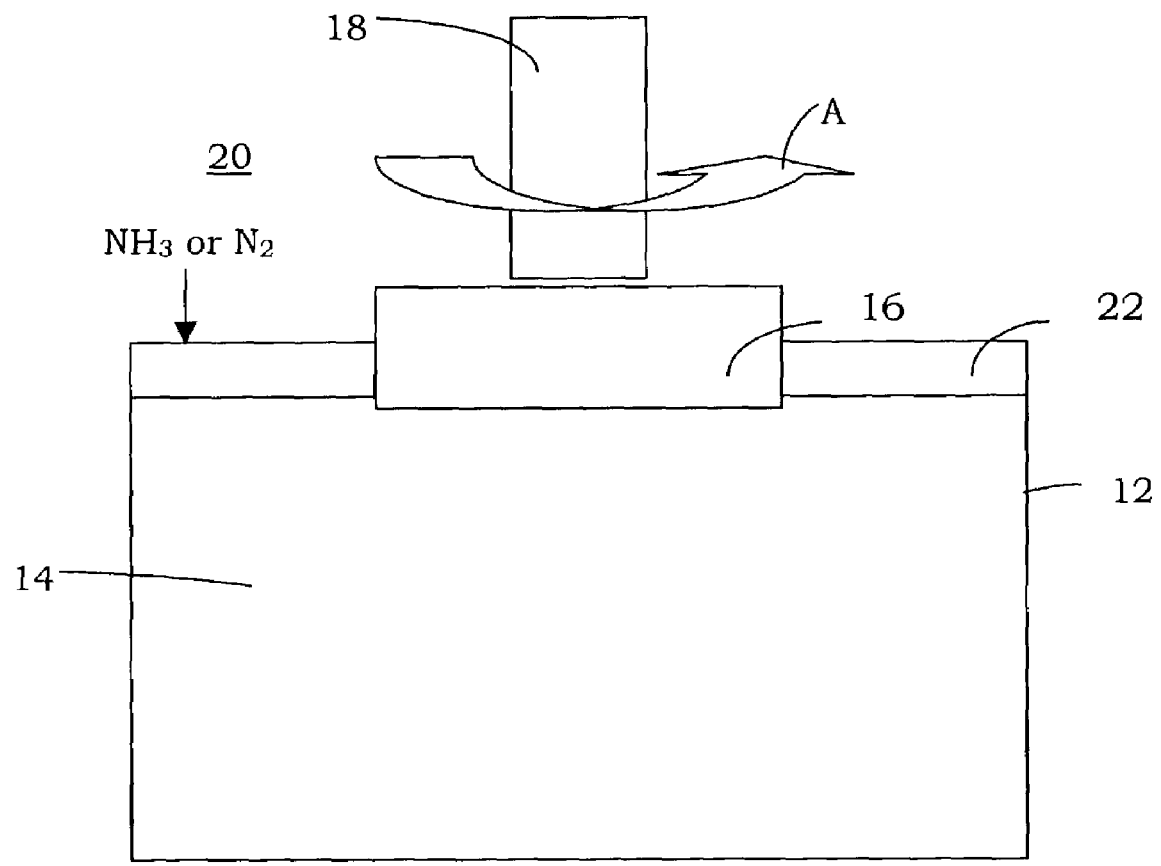
FIG. 4 is a schematic depiction of pulling a gallium nitride boule from gallium melt with sodium flux in a nitrogen-containing ambient.

FIG. 4 depicts a process system 10 whose parts are labeled correspondingly to FIGS. 1 and 3, with the differences that the gallium melt 14 contains the flux component, shown in FIG. 4 as Na, and the atmosphere may be constituted with ammonia as in FIG. 1, or with nitrogen gas.

In the operation of the FIG. 4 system, a GaN seed wafer 16 is attached to the rod 18 for rotation and pulling during the growth process. Gallium and sodium are placed in the reservoir 14. The reservoir is provided with good temperature and thermal gradient control (by heating and monitoring elements of suitable type, not shown in FIG. 3 in the interest of clarity). A moderate pressure of nitrogen or ammonia is flowed through the reactor containing the reservoir to constitute the atmosphere 20 therein.

From the nitrogenous atmosphere, nitrogen in the gas phase will react and be converted to dissolved nitrogen in the gallium/flux melt 14. Nitrogen solubility can be increased by optimization of the concentration of the flux metal, the choice of the flux metal, and the temperature of the melt 14. Although sodium is described as an illustrative metal flux species, any other metal flux materials may be alternatively, or in combination, to advantage. Other illustrative flux species include, without limitation, Group I and Group II metals of the Periodic Table, such as, for specific example, lithium, potassium, cesium, or rubidium.

Due to the presence of the metal flux in the gallium melt, the concentration of the dissolved nitrogen in the liquid is higher than would otherwise occur in the absence of the metal flux component(s). Such higher flux-mediated concentration is a supersaturation for GaN crystal, and GaN will grow on the seed if a proper temperature gradient is present. The GaN seed crystal is in contact with the gallium/flux melt, and the seed crystal is rotated during the growth process to facilitate uniformity of the growth, as the upward translation of the rod 18 and attached seed/boule mass effects continued growth. The pull rate of the rod is determined by the growth rate, which in turn is determined by various factors, including liquid melt temperature, type of metal flux, metal flux concentration, and pressure of the growth ambient (atmosphere 20). The pressure in the reactor is at any suitable value during the growth process, preferably being on the order of a few atmospheres, but higher or lower pressures being useful, as readily determinable for a given application of this embodiment of the invention, within the skill of the art and without undue experimentation.

The specific metal flux material should be selected to increase the nitrogen solubility in the gallium melt, while being inert, i.e., non-incorporated in the GaN boule during the growth process. The concentration of the metal flux in the gallium melt may be up to 50% by weight, based on the weight of the gallium present. Typically, concentrations in the range of from about 5% to about 40% by weight, and more preferably from about 5% to about 25% by weight, based on the weight of the gallium, are usefully employed.

In process C, the temperature of the gallium melt should be selected so as not to exceed the boiling temperature of the metal flux. When sodium is used as the flux metal, the gallium metal temperature should be below a temperature of about 900° C. When lithium is used as a flux, the melt temperature can be as high as 1300° C.

The gas phase ambient in the boule growth process of this embodiment is a nitrogenous atmosphere, e.g., comprising a nitrogen-containing species such as nitrogen or ammonia.

As in previous embodiments, the initial seed wafer can be formed by any suitable techniques such as HVPE techniques, and subsequent seed wafers can be of the same source, or cut from boules manufactured in the boule growth process.

Process D

Seeded Growth for High Temperature, High Pressure Growth

In this embodiment, initial seed wafers are prepared by any suitable techniques such as HVPE techniques. Subsequent seed wafers are similarly obtained or may be derived from GaN boules formed in the boule growth process.

The seed wafer is placed in the reservoir along with liquid gallium, in the reactor. The reactor then is pressurized with nitrogen containing gas and the temperature is raised. The seed wafer is placed in a cool zone in the gallium melt so that the temperature gradient will promote the further growth of GaN to form the boule.

The gallium melt may contain a surfactant to improve the crystal growth on the growing boule surface.

Hydrogen may be added in the nitrogen-containing gas to increase rate of dissolution of nitrogen in the gallium melt, thus, increasing the boule growth rate.

Process E

Seeded Growth for GaN Growth in Supercritical Ammonia

In this technique, bulk GaN is grown from supercritical ammonia, by dissolving GaN powders in supercritical ammonia and recrystallizing the dissolved GaN into larger crystal in an appropriate thermal gradient.

GaN seed wafer, GaN powders and mineralizer are placed into a reservoir in the reactor and the reservoir is filled with liquid ammonia. The mineralizer employed for such purpose is of any suitable type that is effective to enhance the solubility of GaN in the ammonia. Illustrative mineralizers include, without limitation, $KNH_2$ and KI.

The reactor then is sealed and the temperature therein is raised to form supercritical ammonia in the reactor. The GaN seed wafer and the temperature profile in the reactor are arranged so that the seed resides in a cooler region of the reactor. The GaN powder in the hot region is dissolved in the supercritical ammonia, and transported to the seed wafer by the thermal gradient to effect the growth of the GaN boule.

The boules of the invention may be usefully cut or parted and polished to produce wafers useful for fabricating microelectronic, optoelectronic and/or microelectromechanical devices, or device precursor structures therefor, and generally in manufacturing semiconductor products. Alternatively, wafers derived from the boule may be advantageously employed as a GaN seed wafer in a repetition of the boule growth method of the invention, as variously described hereinabove.

While the invention has been illustratively described herein with respect to various illustrative aspects, features and embodiments, it will be appreciated that numerous variations, modifications and other embodiments are possible in the practice of the present invention, and the invention therefore is to be broadly construed as encompassing all such variations, modifications and other embodiments, within its spirit and scope.

What is claimed is:

1. A method of making a GaN boule, comprising:
   (a) providing a gallium melt; and
   (b) contacting a GaN seed wafer with the gallium melt in the presence of a nitrogen source and under a thermal gradient producing growth of gallium nitride on the GaN seed wafer, thereby forming the GaN boule.

2. The method of claim 1, wherein the GaN seed wafer is attached to a rotatable rod, and said contacting involves rotating said rotatable rod to rotate the attached GaN seed wafer while pulling the rod and attached GaN seed wafer from the gallium melt during the growth of the GaN boule on the GaN seed wafer.

3. The method of claim 2, wherein said nitrogen source comprises a nitrogen-containing or ammonia-containing atmosphere.

4. The method of claim 1, wherein the gallium melt comprises a surfactant.

5. The method of claim 4, wherein said surfactant comprising bismuth.

6. The method of claim 1, further comprising forming a GaN crust on a surface of the gallium melt, from reaction between the nitrogen source and the gallium melt.

7. The method of claim 6, wherein said thermal gradient comprises a temperature higher at said GaN crust than at the GaN seed layer, whereby gallium nitride is transported from the crust to the growth of gallium nitride on the GaN seed wafer via dissolved atomic nitrogen in the gallium melt.

8. The method of claim 6, wherein GaN in the crust is decomposed into atomic nitrogen with an equilibrium concentration at temperature at the crust, and said atomic nitrogen equilibrium concentration is at super-saturation relative to temperature at the GaN seed wafer, thereby producing homoepitaxial growth of GaN at the seed wafer.

9. The method of claim 1, wherein the nitrogen source comprises an ammonia-containing atmosphere at a temperature below decomposition temperature of ammonia in said ammonia-containing atmosphere.

10. The method of claim 1, wherein the GaN boule has a diameter of at least 10 millimeters.

11. The method of claim 1, wherein the nitrogen source comprises a nitrogen atmosphere.

12. The method of claim 1, wherein the nitrogen source comprises an ammonia atmosphere.

13. The method of claim 1, wherein the nitrogen source comprises a nitrogen plasma.

14. The method of claim 13, wherein the nitrogen plasma comprises atomic nitrogen, nitrogen ion and dinitrogen ion.

15. The method of claim 1, wherein the gallium melt temperature is from about 900° C. to about 1500° C.

16. The method of claim 1, wherein the gallium melt temperature is from about 1000° C. to about 1400° C.

17. The method of claim 1, wherein the gallium melt temperature is from about 1100° C. to about 1300° C.

18. The method of claim 13, wherein the nitrogen plasma is generated by a discharge technique selected from the group consisting of direct current discharge, radio frequency discharge, and microwave discharge.

19. The method of claim 1, wherein the gallium melt is in combination with a flux material forming a molten gallium/flux composition, wherein the flux material increases nitrogen solubility in gallium in said composition.

20. The method of claim 19, wherein the flux material comprises a metal selected from Group I and Group II metals of the Periodic Table.

21. The method of claim 19, wherein the flux material comprises a metal selected from the group consisting of lithium, sodium, potassium, cesium, and rubidium.

22. The method of claim 19, wherein the flux material comprises sodium.

23. The method of claim 19, wherein the flux material has a concentration in the molten gallium/flux composition of from about 5% to about 50% by weight, based on the weight of the gallium therein.

24. The method of claim 19, wherein the flux material has a concentration in the molten gallium/flux composition of from about 5% to about 40% by weight, based on the weight of the gallium, therein.

25. The method of claim 19, wherein the flux material has a concentration in the molten gallium/flux composition of from about 5% to about 25% by weight, based on the weight of the gallium therein.

26. The method of claim 19, wherein the gallium/flux composition is at temperature below boiling temperature of the flux material in said composition.

27. The method of claim 19, wherein the gallium/flux composition is at temperature below 900° C.

28. The method of claim 1, wherein the GaN seed wafer is disposed in the gallium melt under a nitrogen-containing pressurized atmosphere, the gallium melt is heated to provide said thermal gradient in the gallium melt, and said GaN seed wafer is in a region of the gallium melt at a lower temperature of said thermal gradient, to promote growth of gallium nitride on the GaN seed wafer.

29. The method of claim 28, wherein the GaN boule has a diameter of at least 10 millimeters.

30. A method of making a single crystal GaN boule, comprising:
  (a) providing a gallium melt; and
  (1) contacting a GaN seed wafer with the gallium melt in the presence of a nitrogen source and under a thermal gradient producing growth of gallium nitride on the GaN seed wafer, thereby forming the GaN boule,
wherein:
  the GaN seed wafer is attached to a rotatable rod;
  said contacting involves rotating said rotatable rod to rotate the attached GaN seed wafer while pulling the rod and attached GaN seed wafer from the gallium melt during the growth of the GaN boule on the GaN seed wafer;
  said nitrogen source comprises an ammonia atmosphere forming an ambient environment of the gallium melt and GaN seed wafer;
  a GaN crust is formed on a surface of the gallium melt from reaction between the nitrogen source and the gallium melt;
  optionally, said gallium melt comprises a surfactant;
  said thermal gradient comprises a temperature higher at said GaN crust than at the GaN seed layer, whereby gallium nitride is transported from the crust to the growth of gallium nitride on the GaN seed wafer via dissolved atomic nitrogen in the gallium melt, with GaN in the crust being decomposed into atomic nitrogen with an equilibrium concentration at temperature at the crust, and said atomic nitrogen equilibrium concentration being at super-saturation relative to temperature at the GaN seed wafer, thereby producing homoepitaxial growth of GaN at the seed wafer.

31. A method of making a single crystal GaN boule, comprising:
  (a) providing a gallium melt; and
  (b) contacting a GaN seed wafer with the gallium melt in the presence of a nitrogen source and under a thermal gradient producing growth of gallium nitride on the GaN seed wafer, thereby forming the GaN boule,
wherein:
  the GaN seed wafer is attached to a rotatable rod;
  said contacting involves rotating said rotatable rod to rotate the attached GaN seed wafer while pulling the rod and attached GaN seed wafer from the gallium melt during the growth of the GaN boule on the GaN seed wafer;
  said nitrogen source comprises a nitrogen plasma including atomic nitrogen, nitrogen ion and dinitrogen ion, and forming an ambient environment of the gallium melt and GaN seed wafer;
  the nitrogen plasma is generated by a discharge technique selected from the group consisting of direct current discharge, radio frequency discharge, and microwave discharge;
  the gallium melt temperature is from about 900° C. to about 1500° C.;
  optionally, said gallium melt comprises a surfactant;

a GaN crust is formed on a surface of the gallium melt, from reaction between the nitrogen source and the gallium melt;

said thermal gradient comprises a temperature higher at said GaN crust than at the GaN seed layer, whereby gallium nitride is transported from the crust to the growth of gallium nitride on the GaN seed wafer via dissolved atomic nitrogen in the gallium melt, with GaN in the crust being decomposed into atomic nitrogen with an equilibrium concentration at temperature at the crust, and said atomic nitrogen equilibrium concentration being at super-saturation relative to temperature at the GaN seed wafer, thereby producing homoepitaxial growth of GaN at the seed wafer.

32. A method of making a single crystal (GaN boule, comprising:

(a) providing a gallium melt; and
(b) contacting a GaN seed wafer with the gallium melt in the presence of a nitrogen source and under a thermal gradient producing growth of gallium nitride on the GaN seed wafer, thereby forming the (GaN boule, wherein:

the GaN seed wafer is attached to a rotatable rod;

said contacting involves rotating said rotatable rod to rotate the attached GaN seed wafer while pulling the rod and attached (GaN seed wafer from the gallium melt during the growth of the GaN boule on the GaN seed wafer;

said nitrogen source comprises an ammonia or nitrogen atmosphere forming an ambient environment of the gallium melt and GaN seed wafer;

the gallium melt is in combination with a flux material forming a molten gallium/flux composition, wherein the flux material increases nitrogen solubility in gallium in said composition;

the flux material comprises sodium;

the flux material has a concentration in the molten gallium/flux composition of from about 5% to about 50% by weight, based on the weight of the gallium therein; and the gallium/flux composition is at temperature below 900° C. and below boiling temperature of the flux material in said composition.

33. A method of making a single crystal GaN boule, comprising:

(a) providing a gallium melt; and
(b) contacting a GaN seed wafer with the gallium melt in the presence of a nitrogen source and under a thermal gradient producing growth of gallium nitride on the GaN seed wafer, thereby forming the GaN boule, wherein:

the nitrogen source comprises a nitrogen-containing pressurized atmosphere;

the GaN seed wafer is disposed in the gallium melt under the nitrogen pressurized atmosphere, optionally, said gallium melt comprises a surfactant, optionally, said nitrogen source comprises hydrogen, the gallium melt is heated to provide said thermal gradient in the gallium melt, and the GaN seed wafer is in a region of the gallium melt at a lower temperature of said thermal gradient, to promote growth of gallium nitride on the GaN seed wafer.

34. A method of making a single crystal GaN boule, comprising crowing GaN on a GaN seed wafer in a source medium comprising supercritical ammonia containing solubilized GaN, thereby forming the GaN boule comprising GaN grown on said GaN seed wafer, wherein said source medium comprises a solubilizing component containing any of $KNH_2$ and KI for enhancing the solubility of GaN in ammonia.

35. The method of claim 34, wherein said solubilizing component comprises KI.

36. A method of making a single crystal GaN boule, comprising growing GaN on a GaN seed wafer in a source medium comprising supercritical ammonia containing solubilized GaN, thereby forming the GaN boule comprising GaN grown on said GaN seed wafer, wherein:

a thermal gradient is established in the source medium, and the GaN seed wafer is in a region of the source medium at a lower temperature of said thermal gradient, to promote growth of gallium nitride on the GaN seed wafer;

the solubilized GaN derives from addition of powdered GaN to ammonia and heating of the ammonia to form supercritical ammonia in which said powdered GaN is dissolved to form said solubilized GaN; and said source medium comprises a solubilizing component enhancing the solubility of GaN in ammonia, said solubilizing component comprising $KNH_2$ or KI.

37. A method of making a single crystal GaN boule, comprising contacting a GaN seed wafer with a GaN source environment under process conditions including a thermal gradient in the GaN source environment producing growth of gallium nitride on the GaN seed wafer, thereby forming the GaN boule, wherein the source environment is selected from the group consisting of:

(i) a source environment comprising gallium melt and a nitrogen source; and
(ii) a source environment comprising supercritical ammonia containing solubilized GaN.

38. The method of claim 37, wherein said nitrogen source in said source environment (i) comprises a nitrogen or ammonia atmosphere.

39. The method of claim 37, wherein the single crystal GaN boule has a diameter of at least about 10 millimeters.

40. The method of claim 37, wherein the single crystal GaN boule has a diameter in a range of from about 10 millimeters to about 300 millimeters.

41. The method of claim 37, further comprising the step of cutting a single crystal GaN wafer from the single crystal GaN boule.

42. The method of claim 41, further comprising fabricating a microelectronic, optoelectronic or microelectromechanical device, or a device precursor structure therefore, on and/or in said single crystal GaN wafer.

43. The method of claim 41, wherein the single crystal GaN wafer is employed as a GaN seed wafer in a repetition of the method.

44. The method of claim 37, further comprising the step of cutting multiple single crystal GaN wafers from the single crystal GaN boule.

45. The method of claim 44, further comprising fabricating semiconductor products from said single crystal GaN wafers.

46. The method of claim 44, further comprising the step of mechanical polishing and/or chemical mechanical polishing of the multiple single crystal GaN wafers.

47. The method of claim 34, wherein said solubilizing component comprises $KNH_2$.

* * * * *

UNITED STATES PATENT AND TRADEMARK OFFICE
CERTIFICATE OF CORRECTION

| | |
|---|---|
| PATENT NO. | : 7,097,707, B2 |
| APPLICATION NO. | : 10/328223 |
| DATED | : August 29, 2006 |
| INVENTOR(S) | : Xueping Xu |

Page 1 of 1

It is certified that error appears in the above-identified patent and that said Letters Patent is hereby corrected as shown below:

In column 13, line 58 (claim 24), "gallium, therein" should be -- gallium therein --.

In column 15, line 15 (claim 32), "(GaN" should be -- GaN --.

In column 15, line 21 (claim 32), "(GaN" should be -- GaN --.

In column 15, line 26 (claim 32), "(GaN" should be -- GaN --.

In column 15, line 64 (claim 34), "crowing" should be -- growing --.

Signed and Sealed this

Twelfth Day of December, 2006

JON W. DUDAS
*Director of the United States Patent and Trademark Office*